United States Patent
Yun et al.

(10) Patent No.: US 9,057,953 B2
(45) Date of Patent: Jun. 16, 2015

(54) THINNER COMPOSITION FOR RRC PROCESS, APPARATUS FOR SUPPLYING THE SAME, AND THINNER COMPOSITION FOR EBR PROCESS

(75) Inventors: Hyo-jin Yun, Gyeonggi-do (KR); Sung-gun Shin, Gyeonggi-do (KR); Hyo-sun Lee, Gyeonggi-do (KR); Byung-uk Kim, Gyeonggi-do (KR); Hyun-woo Kim, Gyeonggi-do (KR); Suk-il Yoon, Gyeonggi-do (KR); Oh-hwan Kweon, Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 288 days.

(21) Appl. No.: 13/598,731

(22) Filed: Aug. 30, 2012

(65) Prior Publication Data
US 2013/0078580 A1    Mar. 28, 2013

(30) Foreign Application Priority Data
Sep. 22, 2011    (KR) .......................... 10-2011-0095814

(51) Int. Cl.
G03F 7/16    (2006.01)
C11D 11/00    (2006.01)

(52) U.S. Cl.
CPC ............ *G03F 7/168* (2013.01); *C11D 11/0047* (2013.01)

(58) Field of Classification Search
CPC .............................. C11D 11/0047; G03F 7/168
USPC ........................................................... 510/175
See application file for complete search history.

(56) References Cited

U.S. PATENT DOCUMENTS

| | | | |
|---|---|---|---|
| 2004/0116312 A1* | 6/2004 | Schlicht et al. ............... | 510/175 |
| 2007/0184648 A1* | 8/2007 | Yoon et al. .................... | 438/636 |
| 2008/0227678 A1* | 9/2008 | Koshiyama et al. ........... | 510/176 |
| 2009/0176177 A1* | 7/2009 | Han et al. ...................... | 430/325 |

FOREIGN PATENT DOCUMENTS

| | | |
|---|---|---|
| JP | 2010-152068 | 7/2010 |
| KR | 10-2005-0037855 A | 4/2005 |
| KR | 10-2009-0124196 A | 12/2009 |

* cited by examiner

*Primary Examiner* — Gregory Webb
(74) *Attorney, Agent, or Firm* — Lee & Morse, P.C.

(57) ABSTRACT

A thinner composition for a reduced resist coating process includes an alkyl lactate, cyclohexanone, and an alkyl acetate, wherein an alkyl substituent of the alkyl acetate is a C1 to C5 non-ether based alkyl group.

18 Claims, 7 Drawing Sheets

THINNER COMPOSITION FOR RRC PROCESS, APPARATUS FOR SUPPLYING THE SAME, AND THINNER COMPOSITION FOR EBR PROCESS

CROSS-REFERENCE TO RELATED APPLICATIONS

Korean Patent Application No. 10-2011-0095814, filed on Sep. 22, 2011, in the Korean Intellectual Property Office, and entitled "THINNER COMPOSITION FOR RRC PROCESS, APPARATUS FOR SUPPLYING THE SAME, AND THINNER COMPOSITION FOR EBR PROCESS" is incorporated herein by reference in its entirety.

BACKGROUND

1. Field

Embodiments relate to a thinner composition for a resist reduced coating (RRC) process.

2. Description of the Related Art

With a decrease in the design rule for electronic devices, resulting in smaller features, smaller patterns for the manufacturing of the electronic devices have been considered. For this purpose, an extreme ultraviolet (EUV) lithography photoresist may be used in manufacturing a semiconductor device.

SUMMARY

According to an embodiment, there is provided a thinner composition for a reduced resist coating process or an edge bead removal process, the thinner composition including an alkyl lactate, cyclohexanone, and an alkyl acetate, wherein an alkyl substituent of the alkyl acetate is a C1 to C5 non-ether based alkyl group.

The thinner composition may include about 40 parts by weight to about 90 parts by weight of an alkyl lactate, about 5 parts by weight to about 30 parts by weight of cyclohexanone, and about 1 part by weight to about 30 parts by weight of an alkyl acetate, based on 100 parts by weight of the thinner composition.

The thinner composition may include about 60 parts by weight to about 80 parts by weight of an alkyl lactate, about 10 parts by weight to about 30 parts by weight of cyclohexanone, and about 10 parts by weight to about 20 parts by weight of an alkyl acetate, based on 100 parts by weight of the thinner composition.

The thinner composition may further include a silicon-based surfactant. An amount of the silicon-based surfactant may be in a range of 0.001 parts by weight to about 1 part by weight. The silicon-based surfactant may be a polysiloxane-based surfactant.

An alkyl substituent of the alkyl lactate may be a C1 to C3 alkyl group. The alkyl substituent of the alkyl lactate is a methyl group or an ethyl group.

The alkyl substituent of the alkyl acetate may be a methyl group, an ethyl group, or a propyl group.

The thinner composition may not include methyl ethyl ketone (MEK), a lactone-based material, a propionate-based material, an ether-based material, or a derivative thereof.

The thinner composition may not include methyl ethyl ketone (MEK), γ-butyrolactone, a propionate-based material, an ether-based material, or a derivative thereof.

The thinner composition may not include methyl ethyl ketone (MEK), a lactone-based material, a propionate-based material, propylene glycol monomethyl ether acetate (PGMEA) or propylene glycol monomethyl ether (PGME).

The thinner composition may consist essentially of an alkyl lactate, cyclohexanone, and an alkyl acetate, the alkyl substituent of the alkyl acetate being a C1 to C5 non-ether based alkyl group.

According to an embodiment, there is provided an apparatus for supplying a thinner composition for a reduced resist coating (RRC) process, the apparatus including a sealable container, the thinner composition as claimed in claim 1 that is housed in the container, a nozzle portion that is connected to the container and that is configured to transport the thinner composition to a desired location, a flow controller that is configured to control a volumetric flow rate of the thinner composition to be in a range of 5 $cm^3$/min to 100 $cm^3$/min.

According to an embodiment, there is provided a thinner composition consisting essentially of an alkyl lactate in an amount of about 40 parts by weight to about 90 parts by weight, based on 100 parts by weight of the thinner composition, cyclohexanone in an amount of about 5 parts by weight to about 30 parts by weight, based on 100 parts by weight of the thinner composition, an alkyl acetate in an amount of about 1 part by weight to about 30 parts by weight, based on 100 parts by weight of the thinner composition, and a polysiloxane-based surfactant in an amount of 0 parts to about 1 part by weight, based on 100 parts by weight of the thinner composition.

The amount of the alkyl lactate is about 60 parts by weight to about 80 parts by weight, based on 100 parts by weight of the thinner composition. The amount of the cyclohexanone may be about 10 parts by weight to about 30 parts by weight, based on 100 parts by weight of the thinner composition. The amount of the alkyl acetate may be about 10 parts by weight to about 20 parts by weight, based on 100 parts by weight of the thinner composition.

The amount of the polysiloxane-based surfactant may be 0.001 parts by weight to about 1 part by weight based on 100 parts by weight of the thinner composition.

The alkyl lactate may be methyl lactate and the alkyl acetate may be propyl acetate.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1A:
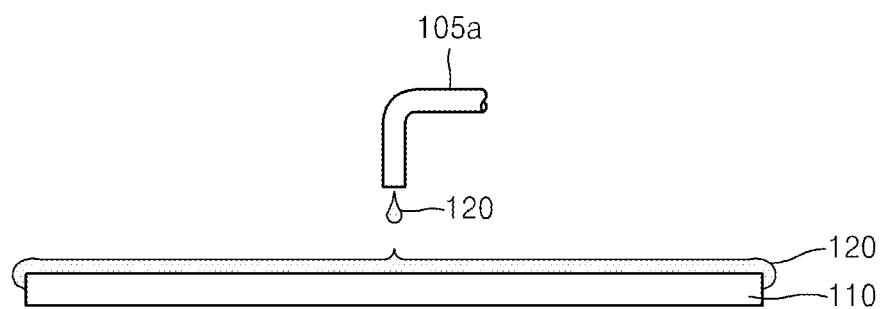
FIGS. 1A to 1C illustrate cross-sectional views of stages of a resist reduced coating (RRC) process according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout.

It will be understood that although the terms 'first' and 'second' are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "comprises," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A reduced resist coating (RRC) process may be performed to achieve a complete and uniform coating of a photoresist for EUV on a substrate and to remove unnecessary and excess photoresist. The term "RRC process" refers to a process for forming a layer of a thinner composition on a substrate before a photoresist layer is formed on the substrate.

Figure 1B:
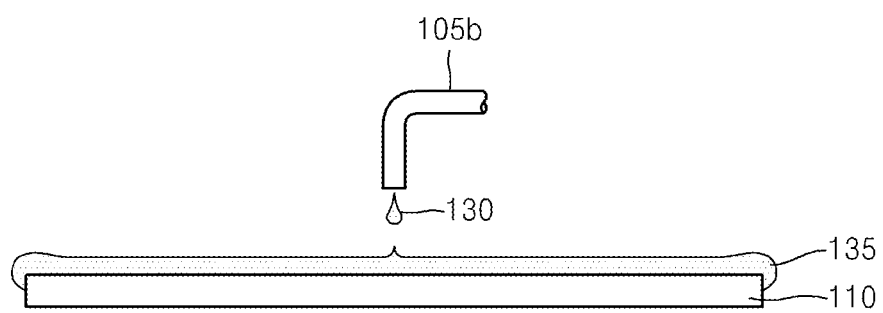
Figure 1C:
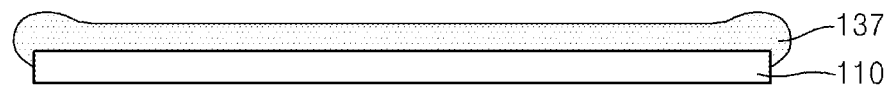

FIGS. 1A to 1C illustrate cross-sectional views of a substrate 110 and a composition layer for explaining the RRC process. Referring to FIG. 1A, a layer of a thinner composition 120 for a RRC process is formed on the substrate 110. The substrate 110 may include a semiconductor material, for example, a Group IV semiconductor, a Group III-V compound semiconductor, or a Group II-VI oxide semiconductor. For example, the Group IV semiconductor may include silicon, germanium, or silicon-germanium. In other implementations, the substrate 110 may be a silicon-on-insulator (SOI) substrate, an insulating substrate including $SiO_2$ or other inorganic oxides, a glass substrate, or the like.

Referring to FIG. 1A, the thinner composition 120 may be supplied onto the substrate 110 through a nozzle 105a while the substrate 110 rotates. Due to a centrifugal force of the thinner composition 120 that is generated by the rotation of the substrate 110, a layer having a substantially uniform thickness may be formed.

Although the layer of the thinner composition 120 may be formed by spin coating as illustrated in FIG. 1A, in other implementations, various other known methods may also be used to form the layer of the thinner composition 120 on the substrate 110.

Referring to FIG. 1B, a photoresist composition 130 may be supplied onto the layer of the thinner composition 120 through a nozzle 105b. As a result, due to the centrifugal force, the photoresist composition 130 may be uniformly coated onto the rotating substrate 110, and simultaneously, may be mixed with the thinner composition 120 to form a mixed layer 135. The nozzle 105b for supplying the photoresist composition 130 may be identical to, or different from, the nozzle 105a for supplying the thinner composition 120 illustrated in FIG. 1A.

Referring to FIG. 1C, baking may be performed thereon at an increased temperature to remove volatile components, thereby forming a photoresist layer 137.

Typically, a thinner composition for a RRC process improves a photoresist coating property. Also, due to the improvement in the photoresist coating property, a surface of a substrate may be sufficiently coated with a relatively small amount of photoresist. Accordingly, the amount of photoresist may be reduced and a more economical process may be achieved.

Embodiments disclosed herein provide a thinner composition for a RRC process, wherein the thinner composition includes an alkyl lactate, cyclohexanone, and an alkyl acetate, wherein an alkyl substituent of the alkyl acetate is a C1 to C5 non-ether based alkyl group.

For example, the thinner composition may include about 40 parts by weight to about 90 parts by weight of an alkyl lactate, about 5 parts by weight to about 30 parts by weight of cyclohexanone, and about 1 part by weight to about 30 parts by weight of an alkyl acetate, based on 100 parts by weight of the thinner composition. In an implementation, the thinner composition may include about 60 parts by weight to about 80 parts by weight of an alkyl lactate, about 10 parts by weight to about 30 parts by weight of cyclohexanone, and about 10 parts by weight to about 20 parts by weight of an alkyl acetate, based on 100 parts by weight of the thinner composition.

Without being limited to any particular theory or mechanism, it may be speculated that the alkyl lactate enhances a polarity of the thinner composition. For example, the alkyl lactate may increase the miscibility between a solvent and a photoresist, which form a photoresist composition. The increased miscibility may lead to high coating efficiency of the photoresist composition.

If the amount of the alkyl lactate is not too small, a sufficient mixing promotion effect may be obtained the coating efficiency may be increased. On the other hand, if the amount of the alkyl lactate not too great, a thinner composition with sufficient volatility may be obtained.

The alkyl lactate may be represented by Formula 1 below. In Formula 1, $R^1$ may be a C1 to C3 alkyl group. For example, $R^1$ may be a methyl group or an ethyl group. For example, the alkyl lactate may be methyl lactate.

<Formula 1>

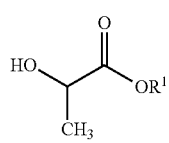

Without being limited to any particular theory or mechanism, it may be speculated that the cyclohexanone may have a function of leveling the photoresist layer, for example, of making a height of the photoresist layer uniform. If the amount of the cyclohexanone is not too small, a photoresist with a uniform height may be obtained. On the other hand, if the amount of the cyclohexanone is not too great, damage to the photoresist layer from excess cyclohexanone may be avoided.

Without being limited to any particular theory or mechanism, it may be speculated that the alkyl acetate may control the spreadability of the photoresist. The alkyl acetate may enable the photoresist to be spread quickly and well over a whole surface. If the amount of the alkyl acetate is not too small, an adequate spreadability of the photoresist may be obtained. On the other hand, if the amount of the alkyl acetate is not too high, a lowering of the miscibility of the thinner composition with respect to the photoresist and the persistence of a photoresist residue may be avoided.

The alkyl acetate may be represented by Formula 2 below. In Formula 2, $R^2$ may be a C1 to C3 alkyl group. For example, $R^2$ may be a methyl group, an ethyl group, or a propyl group. For example, the alkyl acetate may be propyl acetate.

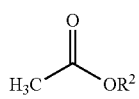

<Formula 2>

The thinner composition may further include a silicon-based surfactant. The silicon-based surfactant may increase the solubility of the thinner composition in a solvent of the photoresist composition so that the photoresist is more easily mixed with the thinner composition.

The amount of the silicon-based surfactant may be in a range of 0.001 parts by weight to about 1 part by weight based on 100 parts by weight of the thinner composition. If the amount of the silicon-based surfactant is not too small, the surfactant effect may be obtained. On the other hand, if the amount of the silicon-based surfactant is not too high, the formation of bubbles, which may cause a defective photoresist coating, may be avoided.

For example, the silicon-based surfactant may include as a repeating unit including silicon, repeating units such as —(SiR$_2$O)$_n$—, —(SiR$_2$)$_n$—, or —(SiR$_2$CH$_2$)$_n$— in which R is a C1 to C5 alkyl group and n is an integer from 20 to 500. For example, the silicon-based surfactant may be a polysiloxane-based surfactant.

Methyl ethyl ketone (MEK), lactone-based materials, propionate-based materials, ether-based materials, and derivatives thereof may be excluded from the thinner composition. As specific examples, lactone-based materials, such as γ-butyrolactone, propionate-based materials that are alkylalkoxy propionates, such as ethylethoxy propionate, and ether-based materials or derivatives thereof, such as propylene glycol monomethyl ether acetate (PGMEA) or propylene glycol monomethyl ether (PGME), may be excluded from the thinner composition.

Moreover, MEK, which is an environmentally regulated material, may be excluded from the thinner composition.

The thinner composition described above may also be used as a thinner composition for an edge bead removal (EBR) process. The term "EBR process" refers to a process for removing a photoresist located on an edge of a substrate to prevent contamination of equipment for a subsequent process after the photoresist is coated on the substrate.

Figure 2A:
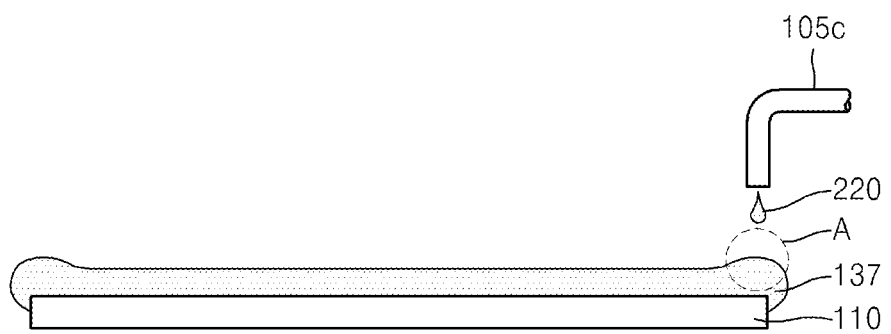
FIGS. 2A and 2B illustrate cross-sectional views of stages of an edge bead removal (EBR) process according to an embodiment.
Figure 2B:
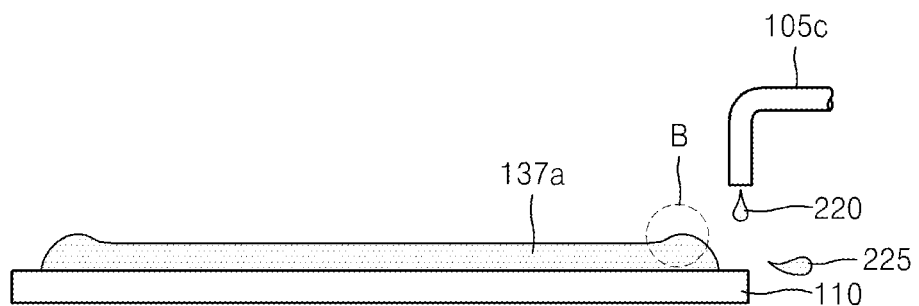

FIGS. 2A and 2B illustrate cross-sectional views of the substrate 110 and the photoresist layer 137 for explaining the EBR process. Referring to FIG. 2A, in general, the height of the photoresist layer 137 on a whole surface of the substrate 110 may not be uniform, and an edge of the photoresist layer 137 is built up, as illustrated by portion A of FIG. 2A. This built-up portion may cause contamination of equipment for a subsequent process. Accordingly, it is desirable to remove the built-up portion.

For this purpose, a nozzle 105c for supplying a thinner composition 220 for an EBR process may be positioned above the built-up portion, and the thinner composition 220 may be ejected while the substrate 110 is rotated. As a result, due to centrifugal force, the thinner composition 220 may be substantially moved only in a direction away from the substrate 110 and thus, portions other than the built-up portion that is to be removed may be maintained.

Referring to FIG. 2B, the thinner composition 220 may dissolve the photoresist included in the built-up portion (see portion A of FIG. 2A) to allow the photoresist to flow out in the form of a mixed solution 225. As described above, the mixed solution 225 flows only away from the substrate 110 due to the centrifugal force. As a result, a portion of the photoresist layer 137 between where the thinner composition 220 is ejected from the nozzle 105c to an edge of the substrate 110 may be removed from the surface of the substrate 110.

After the EBR process, a remaining photoresist layer 137a may still have a built-up portion, as illustrated by portion B of FIG. 2B. However, the height of the built-up portion after the EBR process (i.e., portion B in FIG. 2B), may be substantially smaller than the height of the built-up portion before the EBR process (i.e., portion A in FIG. 2A). These results may be obtained by using the thinner composition 220. For example, if a conventional thinner composition were to be used, such a substantial decrease in height may not be obtained. Also, if a conventional thinner composition were to be used, a tailing phenomenon may occur. Thus, process stability and product yield could be decreased.

Figure 3:
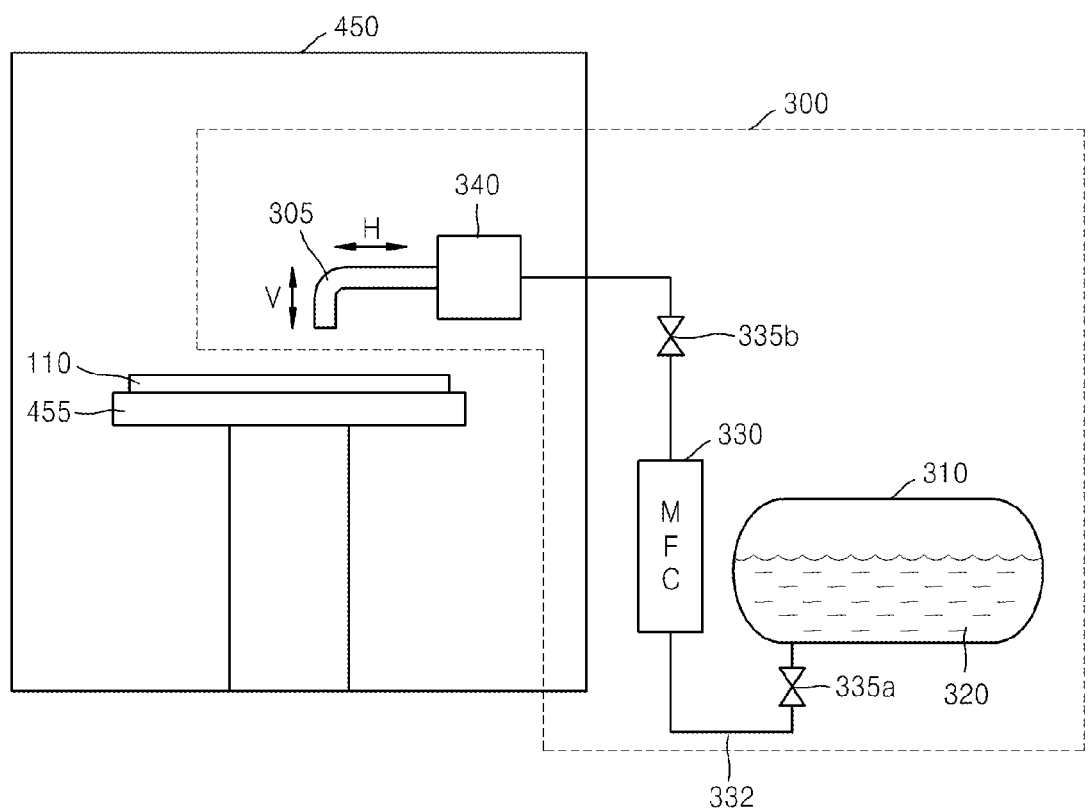
FIG. 3 illustrates a conceptual view of an apparatus for supplying a thinner composition for a RRC process, according to an embodiment.

The embodiments provide an apparatus for appropriately supplying the thinner composition described above onto a substrate. FIG. 3 is a conceptual view of an apparatus 300 for supplying a thinner composition 320 for an RRC process.

Referring to FIG. 3, the apparatus 300 includes a container 310 that is sealable, the thinner composition 320, which is housed in the container 310, a nozzle 305 that is connected to the container 310 in such a manner that the thinner composition 320 is transportable to the container 310 and that is configured to transport the thinner composition 320 to a desired position, and a flow controller 330 that is configured to control a volumetric flow rate of the thinner composition 320 to be in a range of 5 cm$^3$/min to 100 cm$^3$/min. Hereinafter, these elements will be described in detail.

A support 455 that supports a substrate 110 and rotates the substrate 110 at a controlled speed may be arranged in the chamber 450. The support 455 may be connected to a rotating device (not shown) disposed under the support 455 so as to be rotated.

The thinner composition 320 may be housed in the sealable container 310. The container 310 may allow the thinner composition 320 to flow out through a conduit 332. The conduit 332 may be connected to a flow controller 330 that is configured to control the volumetric flow rate of the thinner composition 320 to be in a range of 5 cm$^3$/min to 100 cm$^3$/min. The flow controller 330 may be, for example, a mass flow controller (MFC).

Also, the conduit 332 may be, as described above, connected to the nozzle 305 in such a manner that enables transportation of the thinner composition 320. The apparatus 300 may further include a positioner 340 that controls the position of the nozzle 305 according to purpose. The positioner 340 may be configured to control the position of the nozzle 305 laterally H and/or vertically V.

The conduit 332 may include valves 335a and 335b at appropriate positions that are suitable for controlling the flow of the thinner composition 320.

Hereinafter, the structure and effect of the embodiments will be described in detail with reference to Examples and Comparative Examples. However, it is to be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Thinner compositions of Examples 1 to 12 and Comparative Examples 1 to Comparative Example 11 were prepared using materials and amounts shown in Table 1 below.

TABLE 1

|  | ML | CXN | PAC | PGMEA | PGME | GBL |
|---|---|---|---|---|---|---|
| Example 1 | 80 | 10 | 10 |  |  |  |
| Example 2 | 80 | 5 | 15 |  |  |  |
| Example 3 | 70 | 15 | 15 |  |  |  |
| Example 4 | 70 | 20 | 10 |  |  |  |
| Example 5 | 70 | 10 | 20 |  |  |  |
| Example 6 | 60 | 20 | 20 |  |  |  |
| Example 7 | 60 | 10 | 30 |  |  |  |
| Example 8 | 60 | 30 | 10 |  |  |  |
| Example 9 | 70 | 29 | 1 |  |  |  |
| Example 10 | 50 | 20 | 30 |  |  |  |
| Example 11 | 50 | 30 | 20 |  |  |  |
| Example 12 | 40 | 30 | 30 |  |  |  |
| Comparative Example 1 | 30 | 70 |  |  |  |  |
| Comparative Example 2 | 30 |  |  |  | 70 |  |
| Comparative Example 3 |  | 50 | 50 |  |  |  |
| Comparative Example 4 |  |  |  | 100 |  |  |
| Comparative Example 5 |  |  |  |  |  | 100 |
| Comparative Example 6 | 80 | 10 |  | 10 |  |  |
| Comparative Example 7 | 60 | 10 | 10 | 20 |  |  |
| Comparative Example 8 | 60 | 10 | 10 |  | 20 |  |
| Comparative Example 9 | 70 | 10 | 10 | 10 |  |  |
| Comparative Example 10 | 70 | 10 | 10 |  | 10 |  |
| Comparative Example 11 | 70 | 10 | 10 |  |  | 10 |

In Table 1, ML denotes methyl lactate, CXN denotes cyclohexanone, PAC denotes propyl acetate, PGMEA denotes propylene glycol monomethyl ether acetate, PGME denotes propylene glycol monomethyl ether, and GBL denotes γ-butyrolactone Photoresist Coating Test An RRC process was performed using the thinner compositions prepared according to Examples 1 to 12 and Comparative Example 1 to 11 on a 12-inch silicon substrate on which a silicon dioxide layer was formed. During the RRC process, each of the thinner compositions was sprayed for 2 seconds, and then, spin coating was performed at a rate of 2,000 rpm for 0.5 seconds. Then, a photoresist composition was coated, and the coating uniformity was evaluated as shown in Table 2 below.

TABLE 2

| Photoresist supply amount (cm³) | Krf Photoresist | | | Arf Photoresist | | | EUV Photoresist | | |
|---|---|---|---|---|---|---|---|---|---|
|  | 1 | 2 | 3 | 1 | 2 | 3 | 1 | 2 | 3 |
| Example 1 | Δ | ○ | ○ | Δ | ○ | ○ | Δ | ○ | ○ |
| Example 2 | ○ | ○ | ○ | ○ | ○ | ○ | ○ | ○ | ○ |
| Example 3 | ○ | ○ | ○ | ○ | ○ | ○ | ○ | ○ | ○ |
| Example 4 | ○ | ○ | ○ | ○ | ○ | ○ | ○ | ○ | ○ |
| Example 5 | Δ | ○ | ○ | ○ | ○ | ○ | ○ | ○ | ○ |
| Example 6 | ○ | ○ | ○ | Δ | ○ | ○ | ○ | ○ | ○ |
| Example 7 | ○ | ○ | ○ | ○ | ○ | ○ | ○ | ○ | ○ |
| Example 8 | ○ | ○ | ○ | ○ | ○ | ○ | ○ | ○ | ○ |
| Example 9 | ○ | ○ | ○ | ○ | ○ | ○ | ○ | ○ | ○ |
| Example 10 | ○ | ○ | ○ | ○ | ○ | ○ | ○ | ○ | ○ |
| Example 11 | ○ | ○ | ○ | ○ | ○ | ○ | ○ | ○ | ○ |
| Example 12 | ○ | ○ | ○ | ○ | ○ | ○ | ○ | ○ | ○ |
| Comparative Example 1 | Δ | Δ | ○ | Δ | Δ | ○ | X | X | Δ |
| Comparative Example 2 | X | Δ | ○ | X | Δ | ○ | X | X | X |
| Comparative Example 3 | Δ | Δ | ○ | Δ | Δ | ○ | X | X | Δ |
| Comparative Example 4 | Δ | Δ | ○ | Δ | Δ | ○ | X | X | Δ |
| Comparative Example 5 | X | Δ | ○ | X | Δ | ○ | X | X | X |
| Comparative Example 6 | X | X | ○ | Δ | Δ | ○ | X | X | X |
| Comparative Example 7 | X | Δ | ○ | X | Δ | ○ | X | X | Δ |

TABLE 2-continued

| | Photoresist type | | | | | | | | |
|---|---|---|---|---|---|---|---|---|---|
| | Krf Photoresist | | | Arf Photoresist | | | EUV Photoresist | | |
| Photoresist supply amount (cm³) | 1 | 2 | 3 | 1 | 2 | 3 | 1 | 2 | 3 |
| Comparative Example 8 | X | Δ | ○ | X | Δ | Δ | X | X | Δ |
| Comparative Example 9 | X | X | ○ | X | Δ | ○ | X | X | X |
| Comparative Example 10 | X | X | ○ | X | Δ | ○ | X | X | Δ |
| Comparative Example 11 | X | Δ | ○ | X | Δ | ○ | X | X | X |

○: Coating uniformity with respect to a substrate was maintained constant after coating
Δ: Defective photoresist coating did not occur at an edge of a substrate after coating
X: Defective photoresist coating occurred at an edge of a substrate after coating As shown in Table 2, the thinner compositions of Examples 1 to 12 exhibited excellent coating properties regardless of the type of photoresist. Although some of the photoresists of the Examples have 'Δ' (for example, Examples 1, 5, and 6), it is considered that the thinner compositions of Examples 1 to 12 had overall good coating properties because defective coating did not occur.

However, as shown in Table 2, the thinner compositions of Comparative Examples 1 to 11 resulted in many defective coatings. In particular, the EUV photoresist resulted in more defective coatings than the KrF photoresist or ArF photoresist.

EBR Test

Various types of photoresists shown in Table 3 were coated on a 12-inch silicon substrate on which a silicon dioxide layer was formed. Then, an EBR process was performed by using the thinner compositions prepared according to Examples 1 to 12 and Comparative Example 1 to 11 to remove undesirable photoresist at an edge of a substrate. During the present EBR test, the same spin coater that was used before to evaluate the photoresist coating property was used.

Each of the thinner compositions was sprayed onto the substrate coated with the photoresist through an EBR nozzle while rotating the substrate for 3 seconds at a rate of 300 rpm. Then, the substrate was rotated at rates of 1,000 rpm, 1,500 rpm, and 2,000 rpm, for 10 seconds at each speed, to remove photoresist at the edge of the substrate. The thinner compositions were supplied from a compressed container installed with a pressure gauge. In this case, the compression pressure was 1.0 kg/cm². Also, a volumetric flow rate of each of the thinner compositions sprayed through the EBR nozzle was controlled to be 15 cm³/min.

EBR test results of the respective photoresists, which were evaluated according to the following conditions, are shown in Table 3 below.

TABLE 3

| | Photoresist type | | | | | | | | |
|---|---|---|---|---|---|---|---|---|---|
| | Krf Photoresist | | | Arf Photoresist | | | EUV Photoresist | | |
| EBR condition (rpm) | 1000 | 1500 | 2000 | 1000 | 1500 | 2000 | 1000 | 1500 | 2000 |
| Example 1 | ○ | ◎ | ◎ | ○ | ◎ | ◎ | ◎ | ◎ | ◎ |
| Example 2 | ○ | ◎ | ◎ | ◎ | ◎ | ◎ | ◎ | ◎ | ◎ |
| Example 3 | ○ | ○ | ○ | ○ | ○ | ◎ | ◎ | ◎ | ◎ |
| Example 4 | ○ | ◎ | ◎ | ○ | ◎ | ◎ | ◎ | ◎ | ◎ |
| Example 5 | ○ | ○ | ◎ | ○ | ◎ | ◎ | ◎ | ◎ | ◎ |
| Example 6 | ○ | ◎ | ◎ | ○ | ◎ | ◎ | ◎ | ◎ | ◎ |
| Example 7 | ◎ | ◎ | ◎ | ◎ | ◎ | ◎ | ○ | ◎ | ◎ |
| Example 8 | ◎ | ◎ | ◎ | ◎ | ◎ | ◎ | ◎ | ◎ | ◎ |
| Example 9 | ◎ | ◎ | ◎ | ○ | ○ | ◎ | ○ | ◎ | ◎ |
| Example 10 | ○ | ◎ | ◎ | ○ | ◎ | ◎ | ◎ | ◎ | ◎ |
| Example 11 | ◎ | ◎ | ◎ | ◎ | ◎ | ◎ | ◎ | ◎ | ◎ |
| Example 12 | ○ | ○ | ○ | ○ | ◎ | ◎ | ○ | ◎ | ◎ |
| Comparative Example 1 | Δ | Δ | Δ | Δ | Δ | Δ | X | Δ | Δ |
| Comparative Example 2 | X | X | X | X | X | Δ | X | X | Δ |
| Comparative Example 3 | X | Δ | Δ | X | X | Δ | X | Δ | Δ |
| Comparative Example 4 | Δ | Δ | ○ | Δ | Δ | Δ | X | X | X |
| Comparative Example 5 | X | Δ | ○ | X | Δ | Δ | X | X | X |
| Comparative Example 6 | X | X | Δ | X | X | Δ | X | Δ | Δ |
| Comparative Example 7 | X | X | X | X | X | Δ | X | X | X |
| Comparative Example 8 | X | X | X | X | Δ | Δ | X | X | X |

TABLE 3-continued

| | Photoresist type | | | | | | | | |
|---|---|---|---|---|---|---|---|---|---|
| | Krf Photoresist | | | Arf Photoresist | | | EUV Photoresist | | |
| EBR condition (rpm) | 1000 | 1500 | 2000 | 1000 | 1500 | 2000 | 1000 | 1500 | 2000 |
| Comparative Example 9 | X | X | Δ | X | Δ | Δ | X | X | X |
| Comparative Example 10 | X | Δ | ◯ | X | X | Δ | X | Δ | Δ |
| Comparative Example 11 | X | X | X | X | X | Δ | X | X | Δ |

⊚: Uniformity of EBR line with respect to photoresist after EBR maintained constant.
◯: Uniformity of EBR line with respect to photoresist after EBR was 80% or more.
Δ: Uniformity of EBR line with respect to photoresist after EBR was less than 80%.
X: After EBR, tailing occurred at the edge of photoresist.

<Photoresist Thickness Uniformity Test>

An underlayer was coated using the thinner composition for an RRC process prepared according to Example 3 on a substrate with a target thickness of the underlayer of 110 Å. Also, a photoresist film was coated using the thinner composition for a RRC process prepared according to Example 3 on a substrate with a target thickness of the photoresist film of 680 Å. As a photoresist, a photo-acid generator (PAG) coupled photoresist and a PAG mixed photoresist were separately used.

After the underlayer and the photoresist film were respectively formed on substrates, thicknesses of the underlayer and/or the photoresist film were measured at 19 sites of the respective substrates in thickness directions, and from the results, thickness uniformity was evaluated.

Figure 4A:
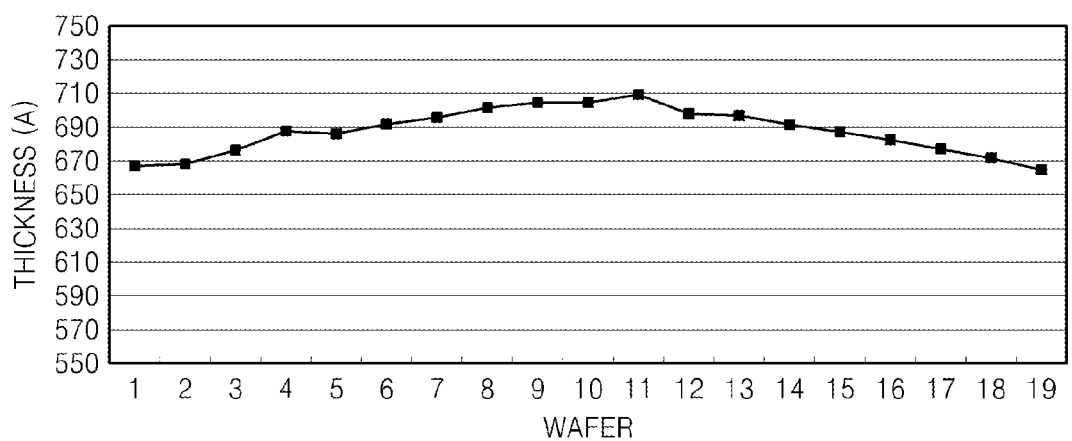
FIGS. 4A to 4C illustrate graphs showing a thickness distribution of a photoresist layer formed by using a thinner composition for a RRC process according to an embodiment.
Figure 4B:
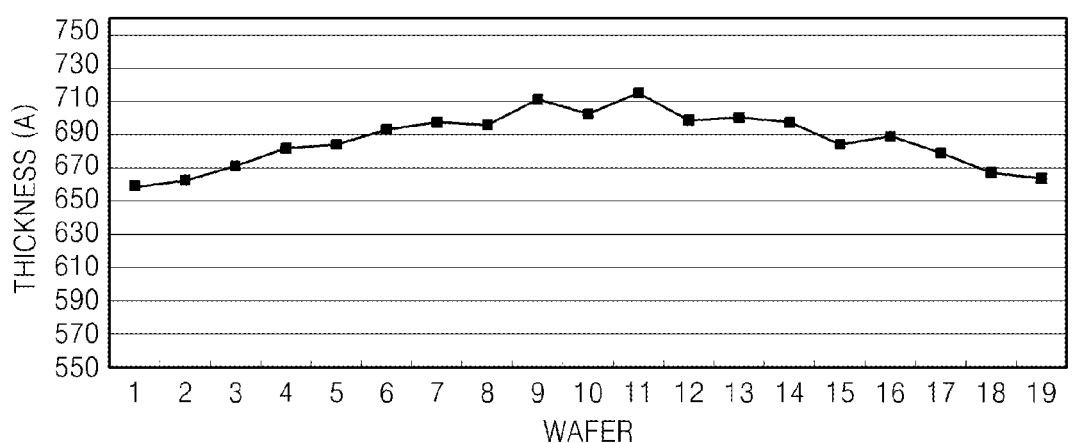
Figure 4C:
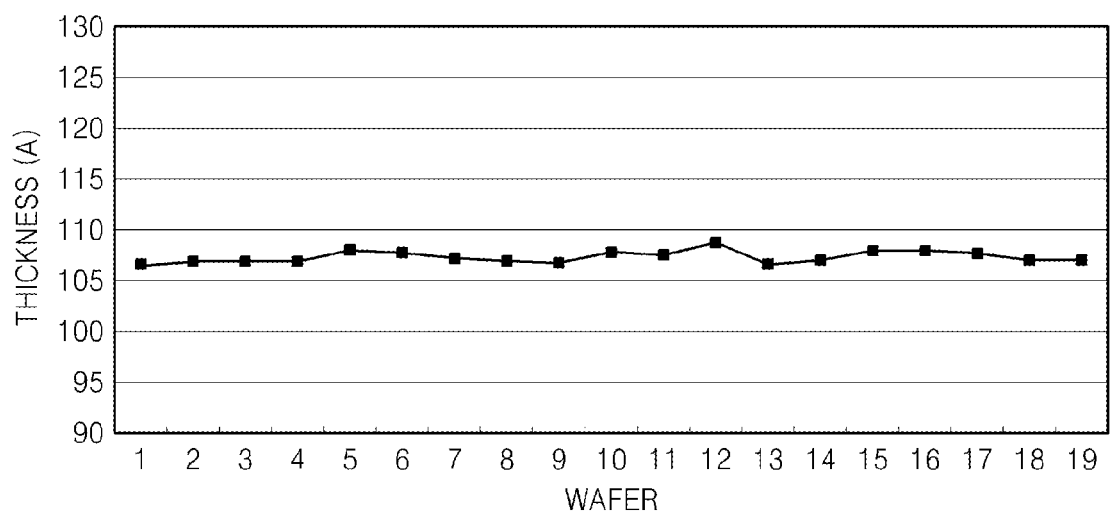

FIG. 4A shows results obtained when a PAG coupled photoresist was formed on a 12-inch substrate, and FIG. 4B shows results obtained when a PAG mixed photoresist was formed on a 12-inch substrate. Also, FIG. 4C shows results when an underlayer was formed on a 12-inch substrate. Thickness measurement results are shown in Table 4 below.

Referring to FIGS. 4A and 4B, it can be confirmed that a central portion of the 12-inch substrate was slightly thicker than an edge thereof. Also, referring to FIG. 4C, a difference between thicknesses of the central portion and edge of the 12-inch substrate was very small.

Referring to Table 4, in the case of the photoresist, the photoresist film was formable within an error margin of about 30 Å or less, and in the case of the underlayer, the underlayer was formable within an error margin of 10 Å or less. Also, because % sigma was around 2.0, the obtained film was very uniform.

TABLE 4

| | PAG coupled photoresist | PAG mixed photoresist | Underlayer |
|---|---|---|---|
| Thickness maximum value (Å) | 708.85 | 705.02 | 117.69 |
| Thickness minimum value (Å) | 665.18 | 658.33 | 110.65 |
| Thickness average (Å) | 687.66 | 683.25 | 113.35 |
| % sigma | 1.94 | 2.03 | 1.71 |
| Thinner supply amount (cm$^3$) | 1.5 | 1.5 | 1.5 |
| Film material supply amount (cm$^3$) | 0.6 | 0.6 | 0.5 |

Also, as shown in FIG. 4, a uniform film quality may be obtainable by using only an amount as small as 0.5 cm$^3$ or 0.6 cm$^3$ of a film material, that is, a photoresist composition or underlayer composition. Accordingly, a thinner composition according to the embodiments may contribute to a substantial decrease in the use of the expensive photoresist material and a decrease in process costs. If only a photoresist composition or an underlayer composition were used without also using the thinner composition for an RRC process according to the embodiments, larger amounts of the photoresist compositions or an underlayer compositions would be needed to render a uniform and successful coating. Also, when conventional thinner compositions were used, many defective coatings occurred, as shown in Table 2. Although not shown in Table 2, when conventional thinner compositions were used, a defective coating occurred more particularly in the case of the PAG coupled photoresist.

EBR Build-Up and Tailing Test

An EBR process was performed on substrates on which a PAG coupled photoresist layer, a PAG mixed photoresist layer, and an underlayer were respectively formed. The EBR process was performed using the thinner composition of Example 8 as a thinner composition for an EBR process. Also, for comparison purposes in terms of performance, an EBR process was performed using a mixture including PGMEA, PGME, and γ-butyrolactone, which mixture is used as a conventional thinner composition for an EBR process.

Then, a build-up height of each of the substrates was measured, and whether tailing occurred was observed.

Figure 5A:
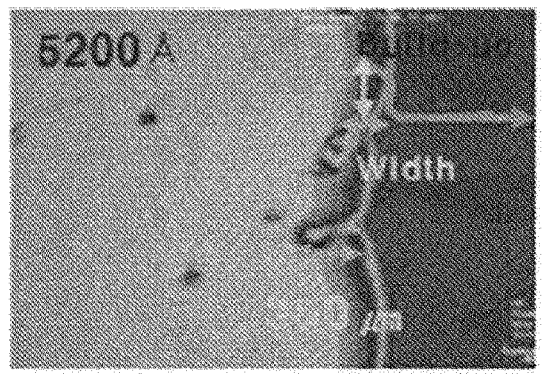
FIGS. 5A to 5C illustrate images obtained when an EBR process was performed using a conventional thinner composition for a RRC process as a thinner composition for an EBR process.
Figure 5B:
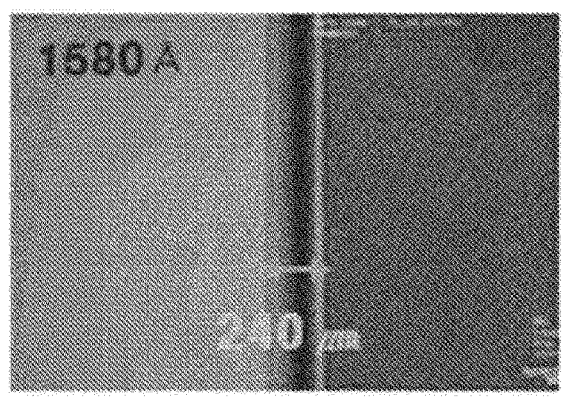
Figure 5C:
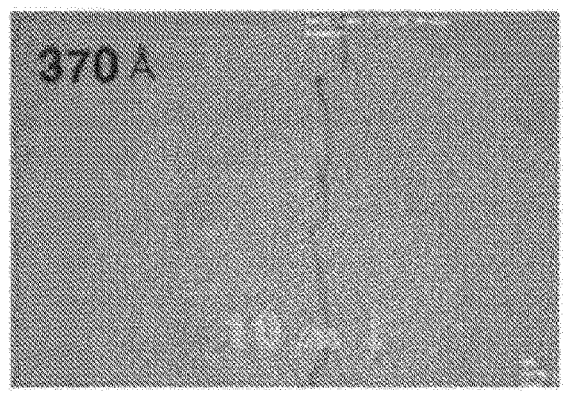

FIGS. 5A to 5C show images of an edge of a substrate on which an EBR process was performed using a conventional thinner composition for an EBR process. Specifically, FIG. 5A shows an image of the edge of the substrate when a PAG coupled photoresist layer was formed thereon, FIG. 5B shows an image of the edge of the substrate when a PAG mixed photoresist layer was formed thereon, and FIG. 5C shows an image of the edge of the substrate when an underlayer was formed thereon.

Referring to FIG. 5A, when the EBR process was performed on the PAG coupled photoresist layer by using a conventional thinner composition for an EBR process, the build-up height was 5,200 Å, and it was confirmed that tailing occurred. Also, as illustrated in FIGS. 5B and 5C, even though tailing did not occur with respect to the EBR processes performed on the PAG mixed photoresist layer or the underlayer, the build-up height was relatively high.

Figure 6A:
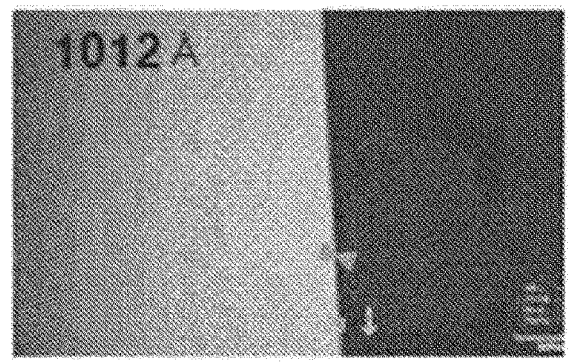
FIGS. 6A to 6C illustrate images obtained when an EBR process was performed using a thinner composition for a RRC process prepared according to an embodiment as a thinner composition for an EBR process.
Figure 6B:
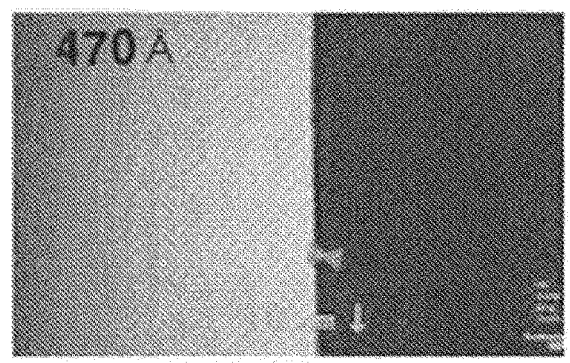
Figure 6C:

FIGS. 6A to 6C show images of an edge of a substrate on which an EBR process was performed using the thinner composition of Example 8. FIG. 6A shows an image of the edge of the substrate when a PAG coupled photoresist layer was formed thereon, FIG. 6B shows an image of the edge of the substrate when a PAG mixed photoresist layer was formed thereon, and FIG. 6C shows an image of the edge of the substrate when an underlayer was formed thereon.

Referring to FIG. 6A, the build-up height was 1,012 Å, which was much lower than the build-up height shown in FIG. 5A. Also, tailing, which was shown in FIG. 5A, did not occur. Furthermore, tailing did not occur with respect to the EBR processes performed on the PAG mixed photoresist layer or the underlayer, as shown in FIGS. 6B and 6C, and the build-up height was relatively smaller than those shown in FIGS. 5B and 5C.

Accordingly, if a thinner composition for a RRC process according to embodiments is used as a thinner composition for an EBR process, contamination of facilities may be reduced, process stability may be high, and production yield may be high.

Precipitate Formation Test

Each of compositions for forming a PAG coupled photoresist layer, a PAG mixed photoresist layer, and an underlayer was mixed with the thinner composition of Example 3 at a ratio of 1:7 and the mixtures were left to sit for 24 hours. It was confirmed that no precipitation occurred for any cases of the PAG coupled photoresist layer, the PAG mixed photoresist layer, and the underlayer.

Facility Stability Test

An O-ring sample, a pipe sample, and a plate sample formed of the same components as in a support were immersed in the thinner composition of Example 3 and the samples were observed for one week. It was confirmed that there was no change in their shapes, weights, or surface states.

By way of summation and review, an EUV photoresist may have very distinctive characteristics that differ from those of conventional ArF or KrF photoresists. Thus, a thinner that is used in a RRC process or the like in connection with a conventional ArF or KrF photoresist may not have satisfactory characteristics for use with a EUV photoresist.

The present embodiments may provide a thinner composition that can be used in a resist reduced coating (RRC) process. The thinner composition may allow a photoresist to be uniformly coated on a substrate without defects, even when the amount of the photoresist is small, thereby allowing manufacturing costs to be reduced.

The present embodiments may provide a thinner composition that can be used in an edge bead removal (EBR) process. The thinner composition may allow an EBR process to be performed without damage to the uniformity of a photoresist layer or without the occurrence of a tailing phenomenon at an edge of the photoresist layer. Accordingly, process stability may be improved and the yield may be increased.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A thinner composition for a reduced resist coating process or an edge bead removal process, the thinner composition comprising:
    about 40 parts by weight to about 90 parts by weight of an alkyl lactate, based on 100 parts by weight of the thinner composition;
    about 5 parts by weight to about 30 parts by weight of cyclohexanone, based on 100 parts by weight of the thinner composition; and
    about 1 part by weight to about 30 parts by weight of an alkyl acetate, based on 100 parts by weight of the thinner composition,
    wherein an alkyl substituent of the alkyl acetate is a C1 to C5 non-ether based alkyl group.

2. The thinner composition as claimed in claim 1, wherein the thinner composition includes about 60 parts by weight to about 80 parts by weight of the alkyl lactate, about 10 parts by weight to about 30 parts by weight of cyclohexanone, and about 10 parts by weight to about 20 parts by weight of the alkyl acetate, based on 100 parts by weight of the thinner composition.

3. A thinner composition for a reduced resist coating process or an edge bead removal process, the thinner composition comprising:
    an alkyl lactate;
    cyclohexanone;
    an alkyl acetate, an alkyl substituent of the alkyl acetate being a C1 to C5 non-ether based alkyl group; and
    a silicon-based surfactant.

4. The thinner composition as claimed in claim 3, wherein the thinner composition includes about 40 parts by weight to about 90 parts by weight of the alkyl lactate, about 5 parts by weight to about 30 parts by weight of cyclohexanone, and about 1 part by weight to about 30 parts by weight of the alkyl acetate, based on 100 parts by weight of the thinner composition.

5. The thinner composition as claimed in claim 3, wherein an amount of the silicon-based surfactant is in a range of 0.001 parts by weight to about 1 part by weight.

6. The thinner composition as claimed in claim 5, wherein the silicon-based surfactant is a polysiloxane-based surfactant.

7. The thinner composition as claimed in claim 1, wherein an alkyl substituent of the alkyl lactate is a C1 to C3 alkyl group.

8. The thinner composition as claimed in claim 7, wherein the alkyl substituent of the alkyl lactate is a methyl group or an ethyl group.

9. The thinner composition as claimed in claim 1, wherein the alkyl substituent of the alkyl acetate is a methyl group, an ethyl group, or a propyl group.

10. The thinner composition as claimed in claim 1, wherein the thinner composition does not include methyl ethyl ketone (MEK), a lactone-based material, a propionate-based material, an ether-based material, or a derivative thereof.

11. The thinner composition as claimed in claim 1, wherein the thinner composition does not include methyl ethyl ketone (MEK), γ-butyrolactone, a propionate-based material, an ether-based material, or a derivative thereof.

12. The thinner composition as claimed in claim 1, wherein the thinner composition does not include methyl ethyl ketone (MEK), a lactone-based material, a propionate-based material, propylene glycol monomethyl ether acetate (PGMEA), propylene glycol monomethyl ether (PGME), or a derivative thereof.

13. The thinner composition as claimed in claim 1, wherein the thinner composition consists essentially of the alkyl lactate, cyclohexanone, and the alkyl acetate, the alkyl substituent of the alkyl acetate being a C1 to C5 non-ether based alkyl group.

14. An apparatus for supplying a thinner composition for a reduced resist coating (RRC) process, the apparatus comprising:
    a sealable container;
    the thinner composition as claimed in claim 1 that is housed in the container;

a nozzle portion that is connected to the container and that is configured to transport the thinner composition to a desired location;

a flow controller that is configured to control a volumetric flow rate of the thinner composition to be in a range of 5 cm³/min to 100 cm³/min.

15. A thinner composition, consisting essentially of:

an alkyl lactate in an amount of about 40 parts by weight to about 90 parts by weight, based on 100 parts by weight of the thinner composition, cyclohexanone in an amount of about 5 parts by weight to about 30 parts by weight, based on 100 parts by weight of the thinner composition, an alkyl acetate in an amount of about 1 part by weight to about 30 parts by weight, based on 100 parts by weight of the thinner composition, an alkyl substituent of the alkyl acetate being a C1 to C4 non-ether based alkyl group, and a polysiloxane-based surfactant in an amount of 0 parts to about 1 part by weight, based on 100 parts by weight of the thinner composition.

16. The thinner composition as claimed in claim 15, wherein:

the amount of the alkyl lactate is about 60 parts by weight to about 80 parts by weight, based on 100 parts by weight of the thinner composition, the amount of the cyclohexanone is about 10 parts by weight to about 30 parts by weight, based on 100 parts by weight of the thinner composition, and the amount of the alkyl acetate is about 10 parts by weight to about 20 parts by weight, based on 100 parts by weight of the thinner composition.

17. The thinner composition as claimed in claim 15, wherein:

the amount of the polysiloxane-based surfactant is 0.001 parts by weight to about 1 part by weight based on 100 parts by weight of the thinner composition.

18. The thinner composition as claimed in claim 15, wherein the alkyl lactate is methyl lactate and the alkyl acetate is propyl acetate.

* * * * *